United States Patent [19]

Liou et al.

[11] Patent Number: 4,771,014

[45] Date of Patent: Sep. 13, 1988

[54] PROCESS FOR MANUFACTURING LDD CMOS DEVICES

[75] Inventors: Fu-Tai Liou, Carrollton; Yu-Pin Han, Dallas; Frank R. Bryant, Denton, all of Tex.

[73] Assignee: SGS-Thomson Microelectronics, Inc., Carrollton, Tex.

[21] Appl. No.: 99,144

[22] Filed: Sep. 18, 1987

[51] Int. Cl.[4] .................. H01L 21/265; H01L 27/00
[52] U.S. Cl. ........................ 437/41; 437/34; 437/44; 437/57; 437/27; 357/23.3; 357/23.11; 357/42
[58] Field of Search ................ 437/34, 41, 44, 57, 437/27, 28, 29, 30, 228, 229; 357/23.3, 23.4, 23.11, 42, 44; 156/643

[56] References Cited

U.S. PATENT DOCUMENTS 4,530,150  7/1985  Shirato ............................ 437/34
4,562,638  1/1986  Schwabe et al. ................. 437/34
4,590,663  5/1986  Haken .............................. 437/44
4,599,789  7/1986  Gasner ............................. 437/57
4,637,124  1/1987  Okuyama et al. ............... 437/41
4,642,878  2/1987  Maeda ............................. 437/44

OTHER PUBLICATIONS

Ogura et al., "A Half-Micron MOSFET Using Double Implanted LDD", IEDM 1982, pp. 718-721.

*Primary Examiner*—Brian E. Hearn
*Assistant Examiner*—Mary Wilczewski
*Attorney, Agent, or Firm*—Roland Plottel

[57] ABSTRACT

A method for making a CMOS integrated circuit device saves on masking steps by using unmasked blanket implantations at various steps of the process, such as setting the threshold voltages of the transistors, forming a lightly doped drain for the N-channel transistor, and for forming the source/drain regions of the N-type transistor.

5 Claims, 3 Drawing Sheets

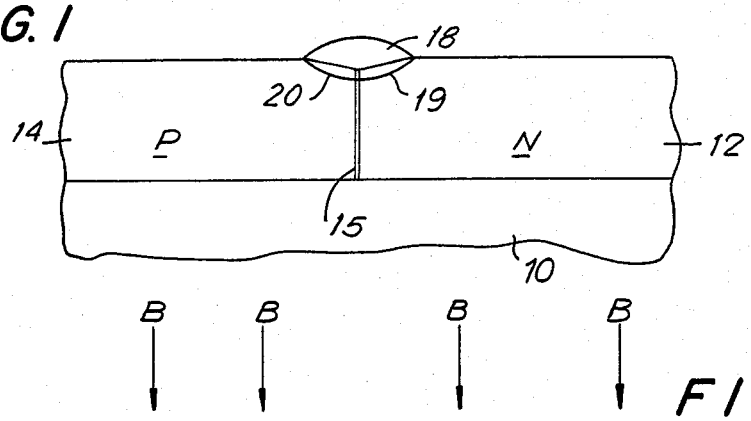
FIG. 1
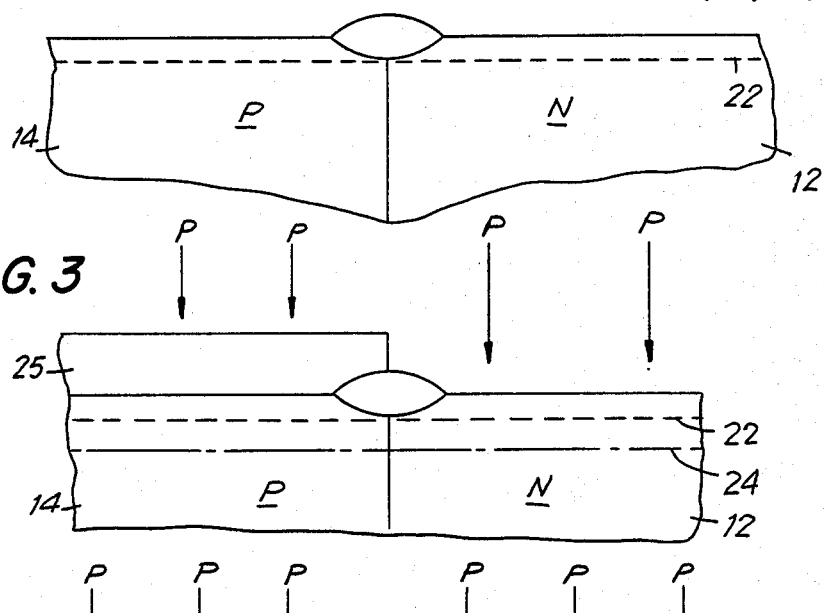
FIG. 2
FIG. 3
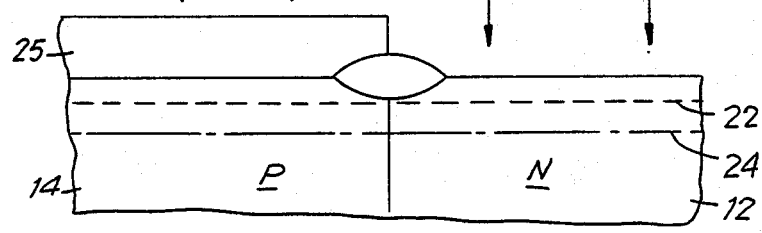
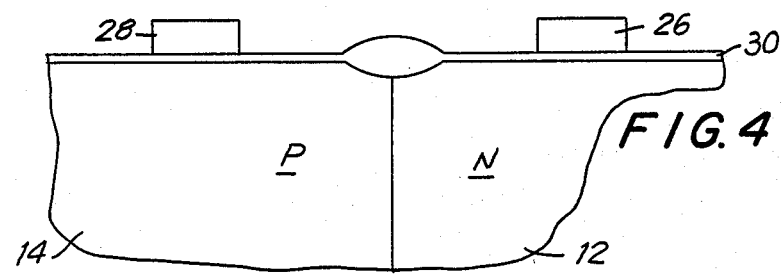
FIG. 4

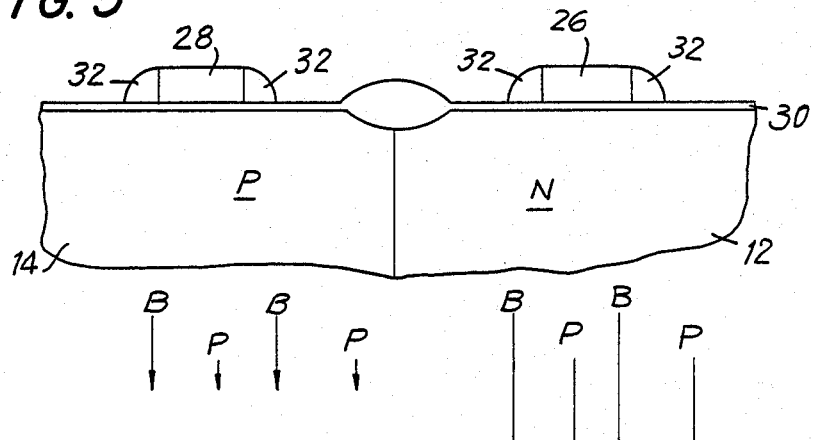
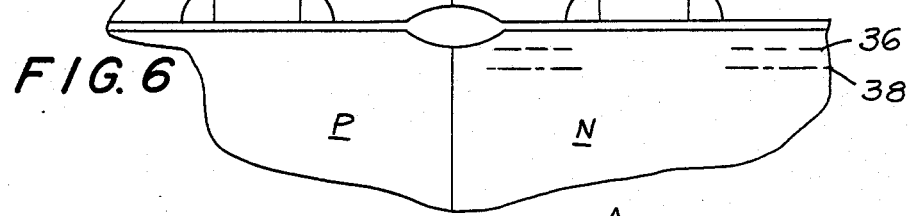
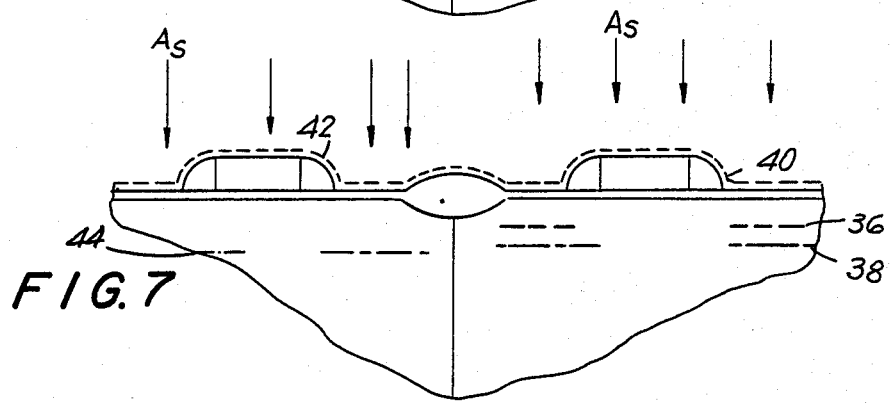

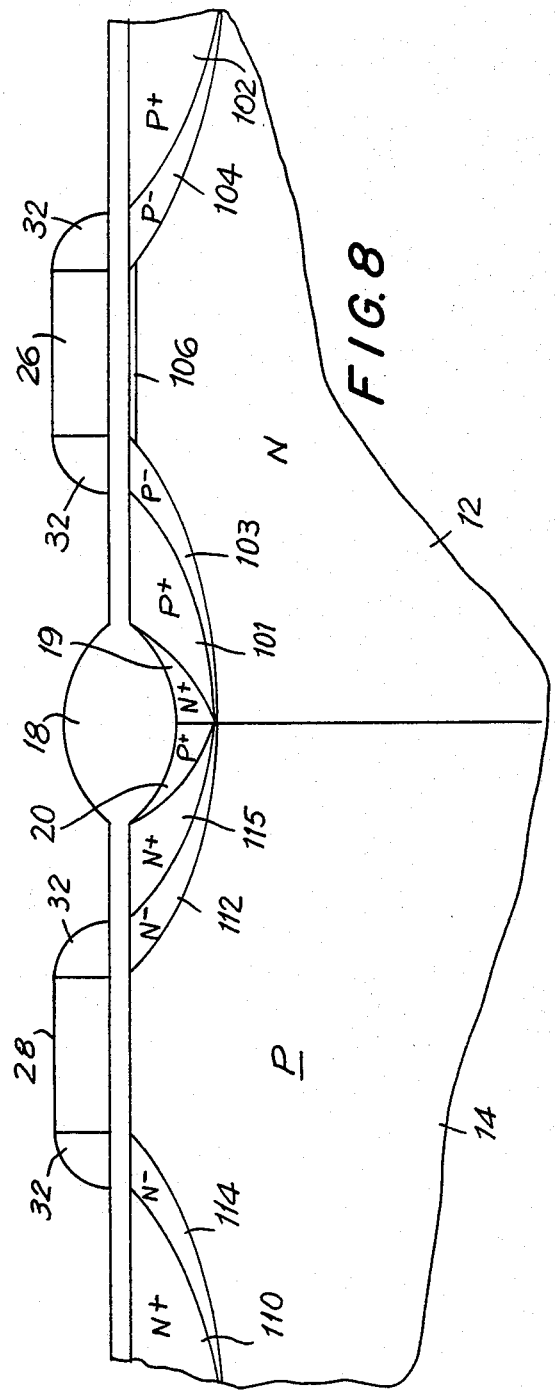

PROCESS FOR MANUFACTURING LDD CMOS DEVICES

This invention relates to the manufacture of complementary metal-oxide-semiconductor (CMOS) integrated circuit devices.

BACKGROUND OF THE INVENTION

The manufacture of CMOS integrated circuit devices involves a large number of processing steps of which probably the most critical are the various photolithographic operations used to form the masks that serve to localize the various implantation steps by which ions, used as dopants, are introduced into the semiconductor (usually silicon) substrate to define the electronic structure of the substrate and to impart the desired electronic properties to the final device. These are commonly referred to as masking steps and a continuing aim in manufacture has been to reduce the number of masking steps to simplify the process, thereby increasing the manufacturing yield and reducing the cost.

The present invention is a process for manufacturing CMOS integrated circuit devices with fewer masking steps than previously used for making comparable devices.

SUMMARY OF THE INVENTION

To this end, in an illustrative embodiment of the invention, to reduce the number of masking steps, greater use is made of blanket, or non-selective, implantation steps that do not require an added mask to introduce donor and acceptor ions as dopants into the substrate. We have found that such non-selective implantation steps may be effectively substituted in particular steps for selective, or masked, implantation steps by appropriately tailoring later selective implantation steps.

BRIEF DESCRIPTION OF THE DRAWING

The drawings, FIGS. 1–8, show in cross section a portion of a silicon wafer in successive stages of its manufacture into CMOS integrated circuit devices in accordance with an illustrative embodiment of the invention.

DETAILED DESCRIPTION

With reference now to the drawings, FIG. 1 shows a monocrystalline silicon wafer in which a large number of integrated circuit devices are formed in parallel for subsequent dicing into discrete chips, each of which includes one or more CMOS integrated circuit devices. Because of the small sizes involved, particularly in the vertical direction, it is not practical to show the figures to scale.

The substrate 10 is shown including along the top or active surface where the devices are to be formed a first well 12 of N-type conductivity adjacent a second well 14 of the opposite or P-type conductivity, for forming a PN junction 15 therebetween. Additionally, at the intersection of the PN junction with the surface, a field oxide layer 18 overlies the surface. At the interface between the field oxide and the silicon substrate, it is usual to include localized more heavily doped N-type and P-type layers, 19 and 20, respectively, to serve as channel stop.

The wells typically are several microns deep, for example between three and four microns, and vary widely in lateral extent. Some wells are of a size to accommodate only a single transistor, others of a size to include dozens of transistors. In the illustrative embodiment being described, the wells are each shown of a size to include only a single transistor.

Various techniques are known for forming such a two-well substrate and the particular one chosen is not critical to the invention. One technique involves starting with a silicon substrate on one surface of which is grown an epitaxial layer that is only lightly doped and then doing a first selective implantation of a dopant of one type to form the first well and then, after masking this implanted region, implanting again with a dopant of the opposite type to form the second well.

This technique permits the most accurate control of the doping levels in each well and so is now generally preferred for state of the art devices. Typically, each of these wells has doping levels in the range of between about $10^{16}$ and $10^{17}$ ions per cubic centimeter.

Alternatively, there may simply be prepared a substrate of the desired doping level for one of the wells and a selective implantation then done to form the second well localized with the first well. This has the advantage of saving one masking step at the expense of reduced control of the doping level in the second well because of the need to compensate for a higher background level of the dopant of opposite type used to dope the initial substrate.

Moreover, after prepration of the two well substrates, there can be formed the channel stops and the field oxide in any known fashion. Generally this involves separate selective implantations to form each of the two channel stops followed by a localized oxidation step.

Once the two well structure described has been formed there is a blanket or non-selective implantation of a P-type impurity, over the entire active surface of the substrate 10, that serves primarily to fix the threshold voltage of the MOS transistors to be formed in the respective wells. In the past, it has been the practice usually to employ selective implantation for this purpose to custom tailor the threshold voltage of each well individually. In the present invention, there is employed a blanket implantation only of acceptor ions and suitable adjustments are made in subsequent implantations. Typically, boron fluoride is used as the source to implant a relatively light dosage of $10^{12}$ boron ions per square centimeter at an accelerating voltage of about fifty thousand electron volts to form a shallow P-type layer, denoted by the broken line 22 in FIG. 2. To avoid cluttering the drawing unnecessarily, the channel stops 19, 20 shown in FIG. 1 are not being shown in the subsequent FIGS. 2–7, although they remain under the field oxide regions 18 to the end and are shown in FIG. 8.

Next, the active surface is covered with a layer of a suitable masking material, for example, a photoresist, that is patterned photolithographically in the usual fashion to expose selectively the N-well region and this is followed by an N-type implantation, typically a donor, such as phosphorous at a dosage of about $10^{12}$ ions per square centimeter at an accelerating voltage of about seventy-five thousand electron volts. This forms a phosphorous-rich layer denoted by the dot-dash line 24 in FIG. 3 which underlies the layer 22 in N-well 12. This implantation is used to control the punch through voltage of P-channel transistors to be formed in this well. Also shown is the mask portion 25 overlying the P-type well 14. After the implantation, the mask 25 is removed.

Similarly, to avoid cluttering the drawing unnecessarily, in the subsequent figures the boron-rich layer 22 and the phosphorous-rich layer 24 are not shown since their effects are confined closely to the surface and primarily influence conductivity rather than the conductivity type.

At this stage, it is convenient to form the gate oxide over the active surface of the substrate in conventional fashion, typically by heating the wafer in an oxidizing atmosphere for a time suitable to form the desired thickness of oxide typically between 150 and 175 Angstroms. This thickness is generally small enough not to impede significantly in any subsequent ion implantations. There is then deposited over the gate oxide a layer of a material suitable for use as the gate electrode. Typically this may either consist of polysilicon doped to be N-type conductive or a composite of an underlying layer of N-doped polysilicon and an overlying layer of a silicide, such as titanium or tantalum silicide, to insure high conductivity to the layer. This layer is thereafter suitably patterned to leave separate portions suitable as gate electrodes 26, 28 over the wells. The resultant is shown in FIG. 4 with gate electrodes 26 and 28, overlying the gate oxide layer 30.

After the gate electrodes have been defined, there follows a blanket implantation of donor ions, such as phosphorous, typically at a dosage of about $10^{13}$ ions per square centimeter, at an accelerating voltage of about fifty thousand electron volts. This layer will provide the lightly doped drain effect desired in the N-channel device to be formed in the P-type well.

Next, it is desirable to form dielectric spacer 32 seen in FIG. 5 on each side edge of the gate electrodes to insure isolation from the source and drain electrodes eventually to be provided and also to insure that the source and drain regions subsequently to be formed do not extend below the gate electrodes, which would undesirably increase the gate capacitances.

The usual technique can also be used to form these dielectric spacers. Typically there is deposited a conformed layer of silicon oxide deposited at low temperature over each electrode of a thickness comparable to the widest width desired of the spacer. Thereafter this silicon oxide layer is etched anisotropically in an etchant that etches vertically much faster than horizontally so that after the layer portion over the top surface of each gate electrode has been removed there remains the edge portions 32 as shown. Typically reactive ion etching (RIE) is used to achieve the desired anisotropic etching.

At this point, as shown in FIG. 6, there is again deposited a layer of masking material, such as a photoresist, that is patterned to cover selectively one of the two wells, leaving the other exposed. As shown, a P-type well is covered with a layer 35, and N-type well 12 is essentially exposed where covered by the gate electrode 26 and its dielectric spacers 32. As previously mentioned, the gate oxide layer 30 is too thin to have any significant masking effect.

There then follows a pair of implantation steps, the order of which is not critical. One is an implantation of an N-type impurity, such as phosphorous, at a dosage of about $10^{13}$ ions per square centimeter and an accelerating voltage of between one hundred thousand and one hundred and twenty thousand electron volts to form a deep implanted layer of phosphorous. The other is an implantation of boron fluoride at a dosage of about $10^{13}$ boron ions per square centimeter at an accelerating voltage of about fifty thousand electron volts to form a shallower implanted layer of boron that will form the source and drain regions of the P-type channel MOS transistor formed in the N-well. The deeper layer of phosphorous will eventually form in known fashion a halo region underlying the source and drain regions and extending between the source and drain regions at the interface with the channel region underlying the gate electrodes as will be discussed later in connection with FIG. 8. After the two successive implantations, the masking layer 35 is removed.

There remains to be formed the source and drain regions of the N-channel transistor to be formed in the P-type well 14. These can be formed in conventional fashion in a manner analogous to that used to form the source and drain regions of the P-channel transistor. This would involve masking the N-type well 12, leaving P-type well 14 exposed and implanting an N-type ion, such as phosphorous or arsenic, to form an implanted layer of such ions on opposite sides of the gate electrode, where not blocked by the gate electrode 28 and its dielectric spacers 32.

To avoid the need for the masking step that such selective implantation involves, the preferred embodiment of the invention uses a differential oxide growth technique. This technique depends on the known fact that on a silicon substrate a thermal oxide will grow faster, and so thicker for a given exposure, the more doped the substrate. As a consequence, if the wafer is exposed to an oxidizing ambient in the form that results after completion of the steps illustrated in FIG. 6, the N-type well portion 12 will grow a surface oxide thicker where the silicon is exposed than will the surface of P-type well portion 14 where similarly exposed.

As a result, by suitably heating the wafer in an oxidizing ambient, there can be formed over the exposed silicon of the N-well a layer 40 of oxide about 700 Angstroms thick while growing a layer 42 only about 200 Angstroms thick over exposed silicon of the P-type well. Heating the wafer for about an hour at 900 C. degrees in an ambient of oxygen that has been bubbled through water to pick up water vapor will produce such results.

Thereafter, without need for providing any additional masking, arsenic of a dose of about $10^{13}$ ions per square centimeter implanted at an accelerating voltage of about sixty thousand electron volts will satisfactorily penetrate the relatively thin oxide layer 42 on the P-type well while being substantially blocked by the thicker oxide layer 40 over the N-type well, as shown by the dashed lines in FIG. 7. As a consequence, there is formed an implanted layer of arsenic denoted by the dot-dashline 44 in the substrate on opposite sides of the gate electrode 28, as is shown in FIG. 7.

Thereafter, the wafer is heated to a suitable temperature for activating the implanted ions so that they can serve to affect the conductivity type where they are located. The resultant structure in the wafer is depicted in FIG. 8. The earlier implanted layer for affecting threshold voltages and punch-through typically are overcompensated by the later heavier dosages of implanted ions as far as affecting conductivity type in the source and drain regions, but they do influence the properties of the gate electrode-gate oxide interface in the desired fashion.

As shown in FIG. 8, the N-type well 12 includes the P-channel transistor comprising heavily doped P-type source/drain regions 101 and 102 provided by the boron implantation step shown in FIG. 6. Associated with each of these regions are the halo regions 103, 104 that are less heavily doped P-type because of the compensating effect of the phosphorous implant shown in FIG. 6. Underlying the gate electrode 26 is the channel region that includes a thin P-type surface layer 106 resulting from the first boron implant shown in FIG. 1. Because of this implant and because the gate electrode includes N-type polysilicon at the interface with the gate electrode, the transistor formed in the N-type well is of the type described as a buried channel P-type transistor. The channel region will also include a deeper more heavily doped N-type layer (not shown) produced by the phosphorous implant depicted in FIG. 2 to provide punch-through protection.

In the P-type well 14 there is formed the N-channel transistor comprising heavily doped N-type source/drain regions 110, 111 produced by the arsenic implant shown in FIG. 7. Associated with these are the less heavily doped N-type halos 114, 115 resulting from the phosphorous implant shown in FIG. 4 before the formation of the spacers on the edges of electrode 28.

It should be apparent that if, instead of the differential oxide growth technique followed by the blanket donor implant used to form the source/drain regions of the N-type transistors, there be employed the double implant technique described in connection with FIG. 6, there would be avoided the need for the blanket donor implant discussed in connection with FIG. 4 for forming the halos of the N-type transistors. Alternatively, if this blanket implant step were retained, there is avoided the need for the later acceptor implant to form the halos in the N-type transistors.

At this point, the various source and drain electrodes to the source and drain regions and the metallization for connecting such electrodes are provided in conventional fashion so the discussion thereof will be omitted.

It is to be understood that the specific embodiment described is merely illustrative of the general principles of the invention and that various modifications may be devised by a worker in the art without departing from the spirit and scope of the invention. In particular, the specific values given, the choice of materials, the particular order of steps may be varied consistent with the principles described.

Moreover, as mentioned earlier it is consistent with the invention to form more than a single transistor in any one well.

What is claimed is:

1. A process for manufacturing CMOS integrated circuit devices including N-type and P-type transistors comprising the steps of:
    preparing a silicon wafer on whose active surface are included contiguous P-type and N-type wells in which are to be formed N-type and P-type transistors, respectively,
    blanket implanting the active surface of this wafer relatively shallowly with acceptor ions for establishing the voltage threshold for the transistors to be formed,
    selectively implanting the N-type wells relatively deeply with donor ions for providing punch-through protection to the P-type transistors to be formed in such wells,
    forming a gate oxide layer over the active surface of the wafer,
    forming gate electrodes separately over the gate oxide layer in the P-type and N-type wells,
    blanket implanting the wafer with donor ions for use in forming lightly doped source/drain in the N-type transistors,
    this implant also provides halo effect for P-type transistors, forming dielectric spacers at the side edges of the gate electrodes,
    selectively implanting the N-type wells with both donor and acceptor ions at accelerating voltages and dosages for forming the source/drain regions and the associated halos of the P-type transistors,
    forming oxide layers which are thicker over the N-type wells than over the P-type wells by differential oxide growth resulting from the faster growth of oxide in the more heavily doped silicon, and
    blanket implanting donor ions for selectively penetrating the less heavily doped oxide layers over the P-type wells for forming the source/drain regions of the N-type transistors.

2. The process of claim 1 in which each of the gate electrodes includes a donor-doped polysilicon layer at its interface with the gate oxide layer.

3. A process for manufacturing CMOS integrated circuit devices including N-type and P-type transistors comprising the steps of:
    preparing a silicon wafer on whose active surface are included contiguous P-type and N-type wells in which are to be formed N-type and P-type transistors, respectively
    blanket implanting the active surface of this wafer relatively shallowly with acceptor ions for establishing the voltage threshold for the transistors to be formed,
    selectively implanting the N-type wells relatively deeply with donor ions for providing punch-through protection to the P-type transistors to be formed in such wells,
    forming a gate oxide layer over the active surface of the wafer,
    forming gate electrodes separately over the gate oxide layer in the P-type and N-type wells,
    blanket implanting the wafer with donor ions for use in forming lightly doped source/drain in the N-type transistors,
    this implant also provides halo effect for P-type transistors, forming dielectric spacers at the side edges of the gate electrodes,
    selectively implanting the N-type wells with both donor and acceptor ions at accelerating voltages and dosages for forming the source/drain regions and their associated halos of the P-type transistors, and
    selectively implanting the P-type wells with donor ions at an accelerating voltage and dosage for forming source/drain regions of the N-type transistors.

4. A process for manufacturing CMOS integrated circuit devices including N-type and P-type transistors comprising the steps of:
    preparing a silicon water on whose active surface are included continguous P-type and N-type wells in which are to be formed N-type and P-type transistors, respectively,
    blanket implanting the active surface of this wafer relatively shallowly with acceptor ions for establishing the voltage threshold for the transistors to be formed,
    selectively implanting the N-type wells relatively deeply with donor ions for providing punch-through protection to the P-type transistors to be formed in such wells, forming a gate oxide layer over the active surface of the water, forming gate electrodes separately over the gate oxide layer, blanket implanting the wafer with donor ions for use in forming lightly doped source/drain in the N-type transistors, this implant also provides halo effect for P-type transistors, forming dielectric spacers at the side edges of the gate electrodes, selectively implanting the N-type wells with both donor and acceptor ions at accelerating voltages and dosages for forming the source/drain regions and associated halos of the P-type transistors, and selectively implanting the P-type wells with both donor and acceptor ions at accelerating voltages and dosages for forming source/drain regions and associated halos of the N-type transistors.

5. The process of either claim 3 or claim 4 in which each of the gate electrodes includes a donor-doped silicon layer at its interface with the gate oxide layer.

* * * * *